(12) United States Patent
Takagi et al.

(10) Patent No.: US 8,575,559 B2
(45) Date of Patent: Nov. 5, 2013

(54) X-RAY IMAGING DEVICE

(75) Inventors: Shin-ichiro Takagi, Hamamatsu (JP);
Yasuhito Yoneta, Hamamatsu (JP);
Hisanori Suzuki, Hamamatsu (JP);
Masaharu Muramatsu, Hamamatsu (JP); Hiroshi Tsunemi, Toyonaka (JP);
Takeshi Tsuru, Kyoto (JP); Tadayasu Dotani, Sagamihara (JP); Takayoshi Kohmura, Hachioji (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 236 days.

(21) Appl. No.: 13/256,870

(22) PCT Filed: Mar. 18, 2010

(86) PCT No.: PCT/JP2010/054682
§ 371 (c)(1),
(2), (4) Date: Sep. 15, 2011

(87) PCT Pub. No.: WO2010/110172
PCT Pub. Date: Sep. 30, 2010

(65) Prior Publication Data
US 2012/0025089 A1    Feb. 2, 2012

(30) Foreign Application Priority Data

Mar. 25, 2009    (JP) .................... 2009-074656

(51) Int. Cl.
*H01L 27/146*    (2006.01)

(52) U.S. Cl.
USPC .................................... 250/370.09

(58) Field of Classification Search
USPC ..................................... 250/370.09
See application file for complete search history.

(56) References Cited

FOREIGN PATENT DOCUMENTS

| | | |
|---|---|---|
| JP | 61-85860 | 5/1986 |
| JP | 1-161184 | 6/1989 |
| JP | 6-302795 | 10/1994 |
| JP | H10-186042 | 7/1998 |
| JP | 2000-55839 | 2/2000 |
| JP | 2001-249184 | 9/2001 |
| JP | 2005-274379 | 10/2005 |
| JP | 2008-107203 | 5/2008 |

*Primary Examiner* — David Porta
*Assistant Examiner* — Hugh H Maupin
(74) *Attorney, Agent, or Firm* — Drinker Biddle & Reath LLP

(57) ABSTRACT

An X-ray imaging device 1 includes a back-illuminated solid-state image pickup element 10 including an X-ray detection section having a plurality of detection pixels arrayed for detecting incident X-rays formed on one surface 11 side, and an X-ray incident surface on the other surface 12, and a shielding layer 20 provided on the incident surface 12 of the image pickup element 10 and to be used for blocking light rays with wavelengths longer than the wavelength of X-rays as a detection target. The shielding layer 20 includes a first aluminum layer 21 provided directly on the incident surface 12, a second aluminum layer 22 provided on the first aluminum layer 21, and an ultraviolet light shielding layer 25 that is provided between the first and second aluminum layers 21 and 22 and is used for blocking ultraviolet light rays. Accordingly, an X-ray imaging device capable of suppressing the influence of detection of noise light in X-ray detection is realized.

5 Claims, 9 Drawing Sheets (a)

(b)

(a)

(b)

(a)

(b)

(a)

(b)

(a)

(b)

(a)

(b)

(a)

(b)

(a)

(b)

X-RAY IMAGING DEVICE

TECHNICAL FIELD

The present invention relates to an X-ray imaging device that acquires an X-ray image by detecting X-rays incident on a solid-state image pickup element.

BACKGROUND ART

An X-ray direct detection CCD (Charge Coupled Device) is an X-ray detector that acquires position information, energy information, and temporal information, etc., of incident X-rays by acquiring an X-ray image by directly capturing X-ray photons by detection pixels of the CCD. Solid-state image pickup elements like this X-ray direct detection CCD (hereinafter, referred to as an X-ray CCD) have excellent position resolution and energy resolution, so that they have been used as standard X-ray detectors in, for example, X-ray astronomical observation satellites (refer to, for example, Patent Documents 1 to 3 for X-ray detectors).

CITATION LIST

Patent Literature

Patent Document 1: Japanese Patent Application Laid-Open No. 2001-249184
Patent Document 2: Japanese Patent Application Laid-Open No. 2008-107203
Patent Document 3: Japanese Patent Application Laid-Open No. H06-302795

SUMMARY OF INVENTION

Technical Problem

The above-described X-ray CCD basically has the same structure as that of an ordinary CCD. Therefore, each detection pixel of the X-ray CCD has detection sensitivity not only to X-rays as a detection target but also to light (noise light) such as ultraviolet light, visible light, and infrared light with wavelengths longer than the wavelength of X-rays. In an image pickup element aiming at X-ray direct detection, detection of such noise light with longer wavelengths (lower energy) causes deterioration, etc., of the S/N performance in X-ray detection.

In order to suppress such detection of noise light, a method has been used in which an X-ray imaging device (X-ray camera) is configured by providing an image pickup element such as an X-ray CCD with a thin film called an OBF (Optical Blocking Filter) formed by vapor-depositing aluminum on a polyimide film. Such an OBF is attached between, for example, an X-ray mirror for X-ray convergence and an image pickup element.

However, in this configuration, a space for attaching an OBF must be secured inside the X-ray imaging device, so that the device increases in size. Further, the film thickness of the OBF must be made thin for transmitting X-rays incident via the OBF to the image pickup element, and the imaging device including the OBF becomes structurally weak. Further, in the case where the imaging device is installed in an X-ray astronomical observation satellite or the like as described above, the device structure becomes complicated due to an exhaust valve, etc., provided specifically for preventing the OBF from being broken by a differential pressure after the satellite is released into space. Along with the complication of the device structure, the risk in operation of the X-ray imaging device installed in an observation satellite also increases.

The present invention has been made in order to solve the above-described problem, and an object thereof is to provide an X-ray imaging device capable of preferably suppressing the influence of detection of noise light.

Solution to Problem

In order to achieve the above-described object, an X-ray imaging device according to the present invention includes: (1) a back-illuminated solid-state image pickup element including an X-ray detection section having a plurality of detection pixels that are one-dimensionally or two-dimensionally arrayed for detecting incident X-rays formed on one surface side, and an X-ray incident surface on the other surface; and (2) a shielding layer provided on the X-ray incident surface of the solid-state image pickup element and to be used for blocking light rays with wavelengths longer than the wavelength of X-rays as a detection target, wherein (3) the shielding layer includes a first aluminum layer provided directly on the X-ray incident surface, a second aluminum layer provided on the first aluminum layer, and an ultraviolet light shielding layer provided between the first aluminum layer and the second aluminum layer and to be used for blocking ultraviolet light rays.

In the above-described X-ray imaging device, as an X-ray direct detection image pickup element, a back-illuminated solid-state image pickup element is used. Further, a shielding layer for noise light rays with wavelengths longer than the wavelength of X-rays is formed directly on the X-ray incident surface of the image pickup element. With this configuration, the entire X-ray imaging device including the image pickup element and the shielding means can be downsized and structurally simplified. The image pickup element and the shielding layer are integrated, so that the imaging device is prevented from becoming structurally weak.

Moreover, in the above-described imaging device, a first aluminum layer to be used for blocking visible light rays and infrared light rays is formed on the incident surface of the image pickup element, and an ultraviolet light shielding layer is further provided thereon. Accordingly, a sufficient shielding effect can be obtained in the entire wavelength range of noise light including ultraviolet light, visible light, and infrared light. On the outer side of the ultraviolet light shielding layer, a second aluminum layer is further provided. Accordingly, the ultraviolet light shielding layer can be protected by preventing the ultraviolet light shielding layer from being eroded by atomic oxygen, etc. By the above, an X-ray imaging device capable of preferably suppressing the influence of detection of noise light in X-ray detection is realized.

Advantageous Effects of Invention

By configuring the X-ray imaging device of the present invention so that a back-illuminated solid-state image pickup element is used as an X-ray direct detection image pickup element and a shielding layer is directly formed on the X-ray incident surface of the image pickup element, the shielding layer which includes at least three shielding layers of, in order from the X-ray incident surface side, a first aluminum layer, an ultraviolet light shielding layer, and a second aluminum layer, influence of detection of noise light in X-ray detection can be preferably suppressed.

DESCRIPTION OF EMBODIMENTS

Figure 1:
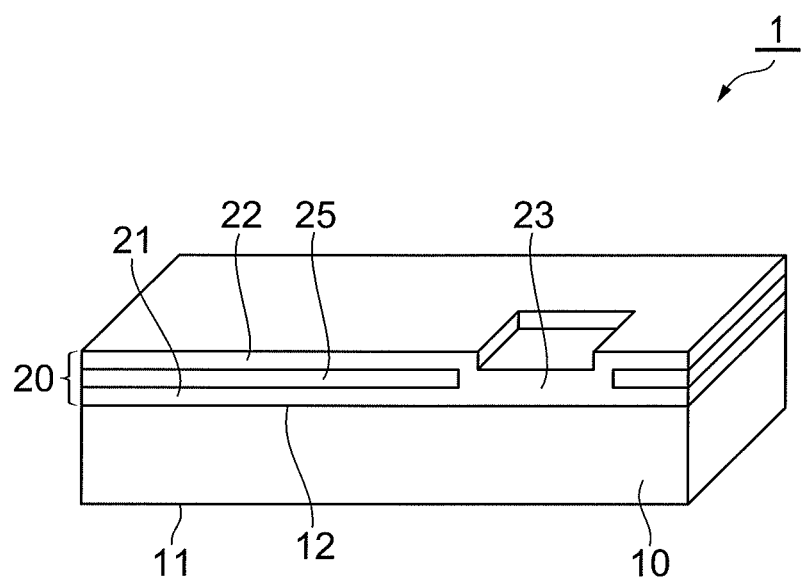
FIG. 1 is a perspective view showing a basic configuration of an X-ray imaging device.

Hereinafter, preferred embodiments of an X-ray imaging device according to the present invention will be described in detail with reference to the drawings. In the description of the drawings, the same elements are provided with the same reference symbols, and overlapping description will be omitted. The dimensional ratios in the drawings are not always equal to those in the description.

FIG. 1 is a perspective view schematically showing a basic configuration of an X-ray imaging device according to the present invention. The X-ray imaging device 1 shown in FIG. 1 includes a solid-state image pickup element 10 and a shielding layer 20. The solid-state image pickup element 10 to be used for detecting X-rays is an X-ray direct detection image pickup element that acquires an X-ray image by directly detecting X-rays incident thereon without a scintillator, etc., and for example, the above-described X-ray CCD can be used.

The solid-state image pickup element 10 is a back-illuminated image pickup element, and has an X-ray detection section (light receiving section) including a plurality of detection pixels that are one-dimensionally or two-dimensionally arrayed for detecting X-rays, formed on one surface (front surface) 11 side. The other surface (back surface) 12 opposite to the front surface 11 serves as an X-ray incident surface on which X-rays as a detection target are incident.

On the X-ray incident surface 12 of the image pickup element 10, the shielding layer 20 to be used for blocking light rays with longer wavelengths (lower energy) than the wavelength of X-rays as a detection target is formed. By this shielding layer 20, noise light including ultraviolet light rays, visible light rays, and infrared light rays to be incident on the image pickup element 10 from the X-ray incident surface 12 side is blocked.

In detail, the shielding layer 20 includes a first aluminum layer 21 provided directly on the incident surface 12 of the image pickup element 10, a second aluminum layer 22 provided on the first aluminum layer 21 (on the side opposite to the incident surface 12 with respect to the first aluminum layer 21), and an ultraviolet light shielding layer 25 provided between the first and second aluminum layers 21 and 22.

In this shielding layer 20, the first aluminum layer 21 is used for blocking visible light rays and infrared light rays of noise light to be incident on the image pickup element 10. The ultraviolet light shielding layer 25 is used for blocking ultraviolet light rays of noise light. The second aluminum layer 22 is used for blocking visible light rays and infrared light rays together with the first aluminum layer 21. The second aluminum layer 22 is the outermost layer (exposed surface) in the shielding layer 20, and also functions as a protection layer for the ultraviolet light shielding layer 25, etc., on the inner side.

Between the first aluminum layer 21 and the second aluminum layer 22 laminated via the ultraviolet light shielding layer 25, a conducting portion 23 for electrically connecting these aluminum layers is provided. The specific configuration of this conducting portion 23 will be described later.

As the ultraviolet light shielding layer 25, specifically, for example, a polyimide layer can be used. As an example of the thickness of each layer constituting the shielding layer 20, it is possible to use a configuration that the thickness of the first aluminum layer 21 is 100 nm (1000 Å), the thickness of the polyimide layer as the ultraviolet light shielding layer 25 is 100 nm (1000 Å), and the thickness of the second aluminum layer 22 is 40 nm (400 Å).

The effect of the X-ray imaging device according to the present invention will be described.

In the X-ray imaging device 1 shown in FIG. 1, as an X-ray direct detection image pickup element, the back-illuminated solid-state image pickup element 10 is used. Further, for noise light rays with wavelengths longer than the wavelength of X-rays as a detection target, instead of providing a shielding means such as an OBF separately from the imaging device 1, the shielding layer 20 is formed directly on the X-ray incident surface 12 of the image pickup element 10. With this configuration, the entire X-ray imaging device 1 including the image pickup element 10 and the shielding layer 20 can be downsized and structurally simplified. The image pickup element 10 and the shielding layer 20 are integrated, so that the imaging device 1 is prevented from becoming structurally weak.

Moreover, in the back-illuminated image pickup element 10, an electrode or the like of absorbing ultraviolet light rays is not formed on the X-ray incident surface 12, so that each pixel of the X-ray detection section formed on the surface 11 side has detection sensitivity for noise light in the wavelength range including ultraviolet light rays, visible light rays, and infrared light rays. In the configuration in which only a shielding layer of aluminum is provided on the X-ray incident surface 12, a sufficient shielding effect is not obtained against ultraviolet light rays although visible light rays and infrared light rays are blocked.

On the other hand, in the X-ray imaging device 1 of FIG. 1, the first aluminum layer 21 to be used for blocking visible light rays and infrared light rays is formed on the incident surface 12 of the image pickup element 10, and the ultraviolet light shielding layer 25 is further provided thereon. Accordingly, a sufficient shielding effect can be obtained in the entire wavelength range of noise light including ultraviolet light rays, visible light rays, and infrared light rays. Here, generally, the wavelength range of ultraviolet light is about 10 nm to 400 nm, the wavelength range of visible light is about 400 nm to 750 nm, and the wavelength range of infrared light is about 750 nm to 100 μm.

On the outer side of the ultraviolet light shielding layer 25, the second aluminum layer 22 is further provided. According to this second aluminum layer 22, a sufficient shielding effect can be obtained against visible light rays and infrared light rays by the combination of the first and second aluminum layers 21 and 22 even when a pinhole or the like exists in the first aluminum layer 21. The second aluminum layer 22 also has a function of reducing heat flowing-in due to radiation, etc., to the solid-state image pickup element 10.

In the case where the X-ray imaging device is installed in an observation satellite, etc., and used in space, erosion of the ultraviolet light shielding layer (for example, polyimide layer) due to atomic oxygen, etc., present in its orbit becomes a problem. On the other hand, according to the above-described configuration in which a second aluminum layer 22 is provided on the outer side of the ultraviolet light shielding layer 25, erosion of the ultraviolet light shielding layer 25 due to atomic oxygen, etc., can be suppressed. By the above, with the above-described configuration, an X-ray imaging device 1 capable of preferably suppressing the influence of detection of noise light in X-ray detection is realized.

Here, in the shielding layer 20, as the ultraviolet light shielding layer 25 to be provided between the first and second aluminum layers 21 and 22, specifically, as described above, a shielding layer formed of a polyimide layer is preferably used. With this polyimide layer, a sufficient shielding effect can be obtained against ultraviolet light rays to be incident on the image pickup element 10.

More generally, the material of the ultraviolet light shielding layer 25 is not limited to polyimide, but for example, organic materials such as Teflon (registered trademark) and PET, etc., or materials of low atomic numbers such as carbon and beryllium can also be used. The material of the ultraviolet light shielding layer 25 is preferably selected by considering detailed conditions such as the wavelength (energy) of ultraviolet light rays that are desired to be cut in the actual imaging device 1 and the energy, etc., of X-rays as a detection target.

In the shielding layer 20 configured as described above, the second aluminum layer 22 is preferably the outermost layer in the shielding layer 20. Accordingly, erosion of the shielding layer (for example, polyimide layer) due to atomic oxygen, etc., described above can be reliably suppressed.

As the range of the thickness of each layer constituting the shielding layer 20, for example, it is preferable that the thicknesses of the first and second aluminum layers 21 and 22 are respectively not more than 100 nm, and the thickness of the ultraviolet light shielding layer 25 of polyimide is not less than 50 nm and not more than 300 nm, respectively. However, as for these detailed configuration conditions of the shielding layer 20, the intensities and wavelength distributions, etc., of X-rays and noise light rays differ depending on the usage environment and X-ray detection conditions, etc., of the imaging device 1, so that the optimum film thickness, etc., of each layer of the shielding layer 20 changing according to these conditions must be considered.

Further, as schematically shown in FIG. 1, the shielding layer 20 having the above-described lamination structure is preferably provided with a conducting portion 23 for electrically connecting the first aluminum layer 21 and the second aluminum layer 22. Accordingly, the second aluminum layer 22 positioned on the outer side can be prevented from being electrically-charged, and the image pickup element 10 can be operated stably.

In this case, the conducting portion 23 is preferably provided in a region excluding a region corresponding to the X-ray detection section (in a region out of the X-ray detection section as viewed in the X-ray incident direction) on the solid-state image pickup element 10. By thus setting the position at which the conducting portion 23 is provided, the ultraviolet light shielding effect for the X-ray detection section can be prevented from being deteriorated by formation of the conducting portion 23 between the first and second aluminum layers 21 and 22, and the entire X-ray detection section including a plurality of detection pixels can be reliably shielded from noise light.

The configuration of the X-ray imaging device according to the present invention will be further described according to detailed embodiments. In the following drawings, in a top view showing a configuration of the X-ray imaging device viewed in the X-ray incident direction, for easy viewing of the drawings, the portion corresponding to the conducting portion 23 is shaded.

Figure 2:
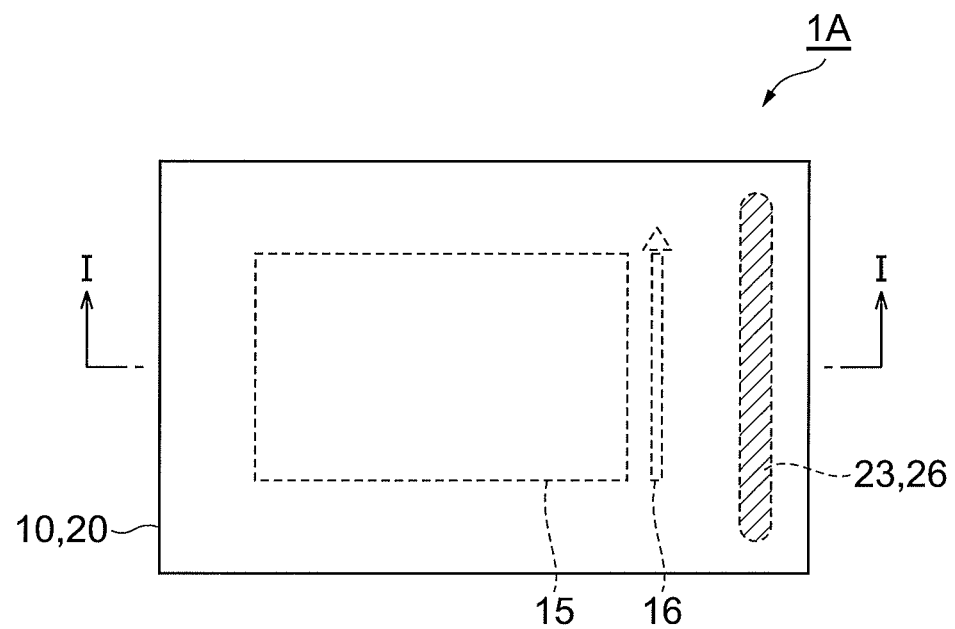
FIG. 2 includes (a) a top view, and (b) a side sectional view showing a configuration of a first embodiment of the X-ray imaging device.
Figure 2:
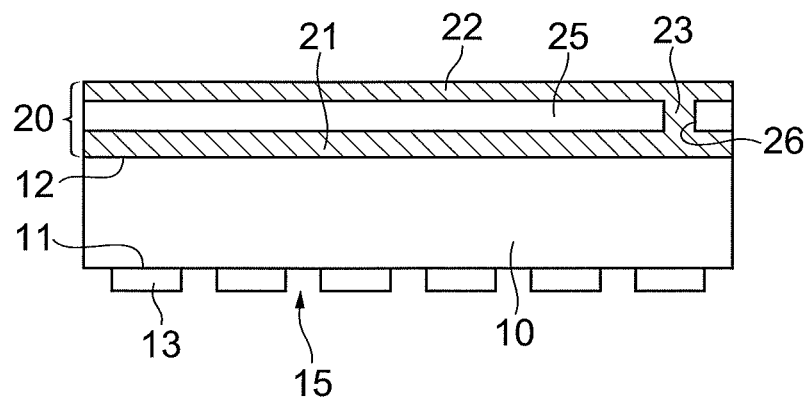

FIG. 2 is a figure including (a) a top view and (b) a side sectional view showing a configuration of a first embodiment of the X-ray imaging device. Here, (b) in FIG. 2 is a sectional view along line I-I shown in (a) in FIG. 2. The X-ray imaging device 1A of the present embodiment includes a solid-state image pickup element 10 and a shielding layer 20. The shielding layer 20 includes a first aluminum layer 21, an ultraviolet light shielding layer 25, and a second aluminum layer 22.

On the front surface (lower surface in the drawing) 11 side of the image pickup element 10, in a predetermined range, a rectangular X-ray detection section 15 including a plurality of detection pixels two-dimensionally arrayed is provided. On one side (right side in the drawing) of the X-ray detection section 15, a charge transfer section 16 for transferring and outputting charges generated by detecting X-rays by each pixel of the detection section 15 is provided. On the surface 11 of the image pickup element 10, as schematically shown in (b) in FIG. 2, elements such as surface electrodes 13 necessary for realizing the function of the image pickup element 10 (for example, CCD) are formed.

In the X-ray imaging device 1A of the present embodiment, in the shielding layer 20 in a region excluding a region corresponding to the X-ray detection section 15 of the image pickup element 10, that is, in the specific example shown in (a) in FIG. 2, in a region sandwiched by the right side of the X-ray detection section 15 and the right side of the image pickup element 10, an opening 26 extending along the right side of the image pickup element 10 is provided in the ultraviolet light shielding layer 25. By filling this opening 26 with aluminum, the conducting portion 23 for electrically connecting the aluminum layers 21 and 22 is formed. With this configuration, by conduction between the aluminum layers 21 and 22 by the conducting portion 23 while securing the noise light shielding effect for the entire X-ray detection section 15 by the shielding layer 20, the second aluminum layer 22 can be preferably prevented from being electrically-charged.

Figure 3:
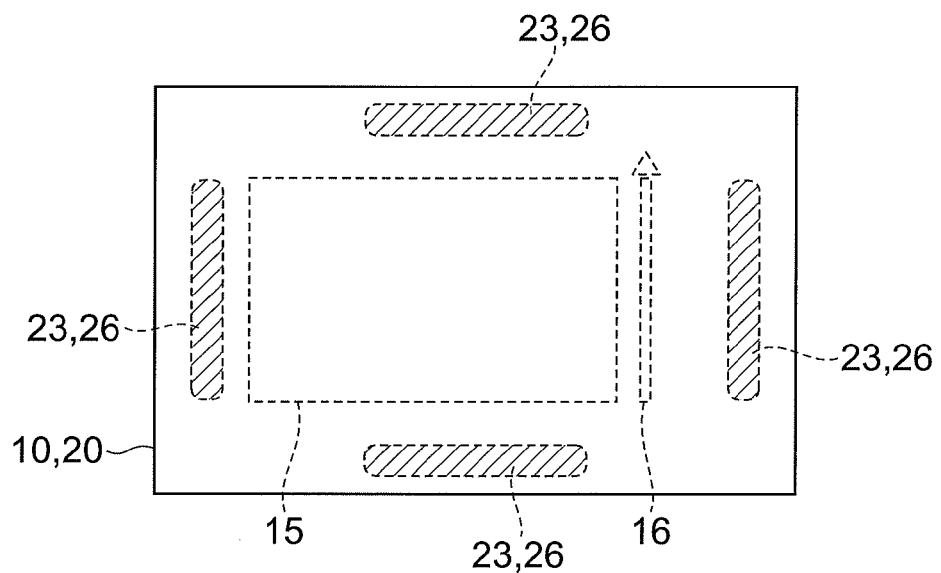
FIG. 3 includes top views showing variation examples of the X-ray imaging device shown in FIG. 2.
Figure 3:
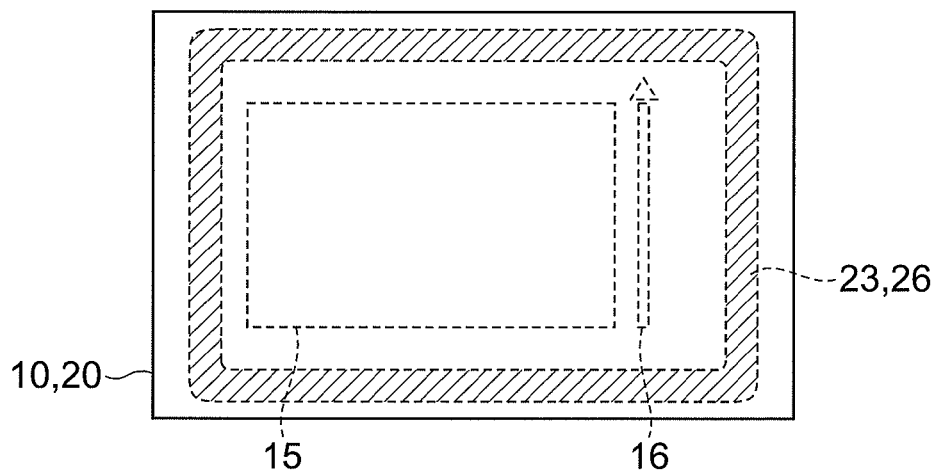

As the configuration of the opening 26 and the conducting portion 23 in the ultraviolet light shielding layer 25, specifically, various configurations can be used as shown by variation examples in FIG. 3 of the X-ray imaging device shown in FIG. 2. In the configuration shown in (a) in FIG. 3, in the shielding layer 20 in the region sandwiched by the right side of the detection section 15 and the right side of the image pickup element 10, the region sandwiched by the left side of the detection section 15 and the left side of the image pickup element 10, the region sandwiched by the upper side of the detection section 15 and the upper side of the image pickup element 10, and the region sandwiched by the lower side of the detection section 15 and the lower side of the image pickup element 10, openings 26 are provided in the ultraviolet light shielding layer 25 in these regions respectively, and conducting portions 23 are formed by filling these openings 26 with aluminum. In the configuration shown in (b) in FIG. 3, in the shielding layer 20 in the above-described regions, an opening 26 integrated so as to surround the detection section 15 is provided, and a conducting portion 23 is formed by filling this opening 26 with aluminum.

Figure 4:
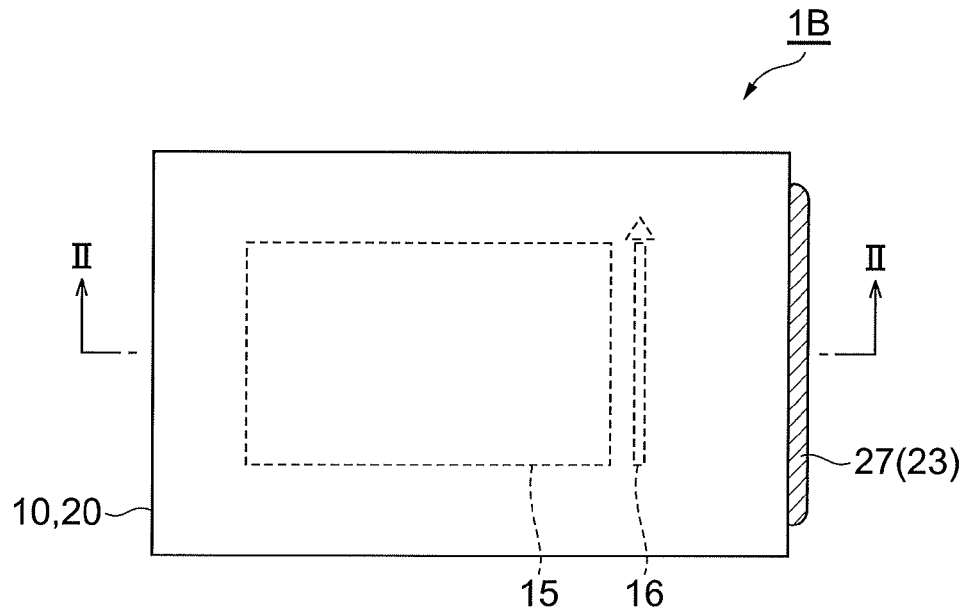
FIG. 4 includes (a) a top view, and (b) a side sectional view showing a configuration of a second embodiment of the X-ray imaging device.
Figure 4:
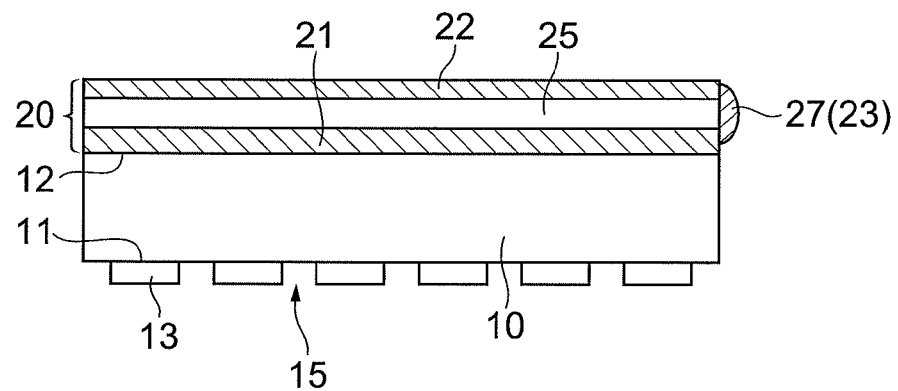

FIG. 4 is a figure including (a) a top view and (b) a side sectional view showing a configuration of a second embodiment of the X-ray imaging device. Here, (b) in FIG. 4 is a sectional view along line II-II shown in (a) in FIG. 4. The X-ray imaging device 1B of the present embodiment includes a solid-state image pickup element 10 and a shielding layer 20. The configuration of the image pickup element 10 and the basic lamination structure of the shielding layer 20 are the same as those of the X-ray imaging device 1A shown in FIG. 2.

In the X-ray imaging device 1B of the present embodiment, on the right side surface of the shielding layer 20 including the aluminum layers 21 and 22 and the ultraviolet light shielding layer 25, a resin conducting portion 27 that is made of a conductive resin and functions as a conducting portion 23 is provided. Also with this configuration, by conduction between the aluminum layers 21 and 22 by the resin conducting portion 27, the second aluminum layer 22 can be preferably prevented from being electrically-charged.

Figure 5:
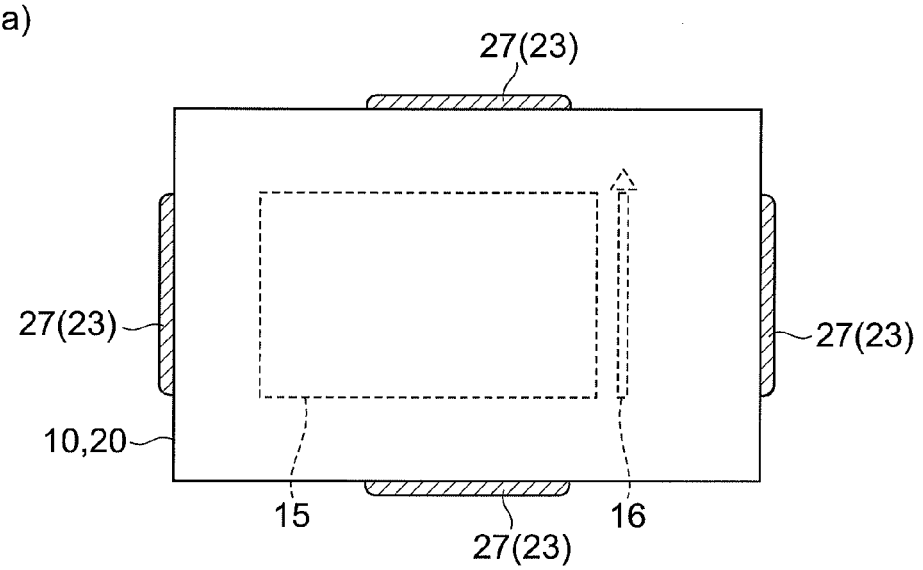
FIG. 5 includes top views showing variation examples of the X-ray imaging device shown in FIG. 4.
Figure 5:
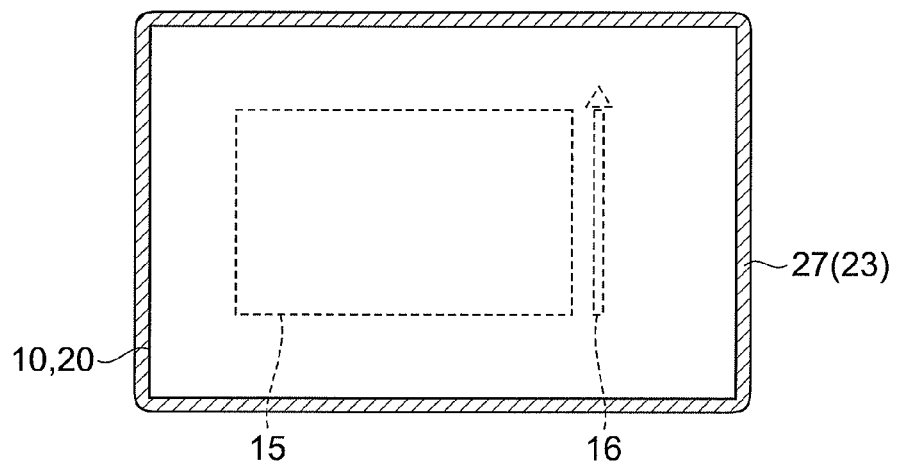

As the configuration of the conducting portion 23 using the resin conducting portion 27, specifically, various configurations can be used as shown by variation examples in FIG. 5 of the X-ray imaging device shown in FIG. 4. In the configuration shown in (a) in FIG. 5, on the right side surface, the left side surface, the upper side surface, and the lower side surface of the shielding layer 20, resin conducting portions 27 each functioning as a conducting portion 23 are provided. In the configuration shown in (b) in FIG. 5, on the above-described side surfaces, a resin conducting portion 27 that is integrated so as to surround the shielding layer 20 and functions as a conducting portion 23 is provided.

Figure 6:
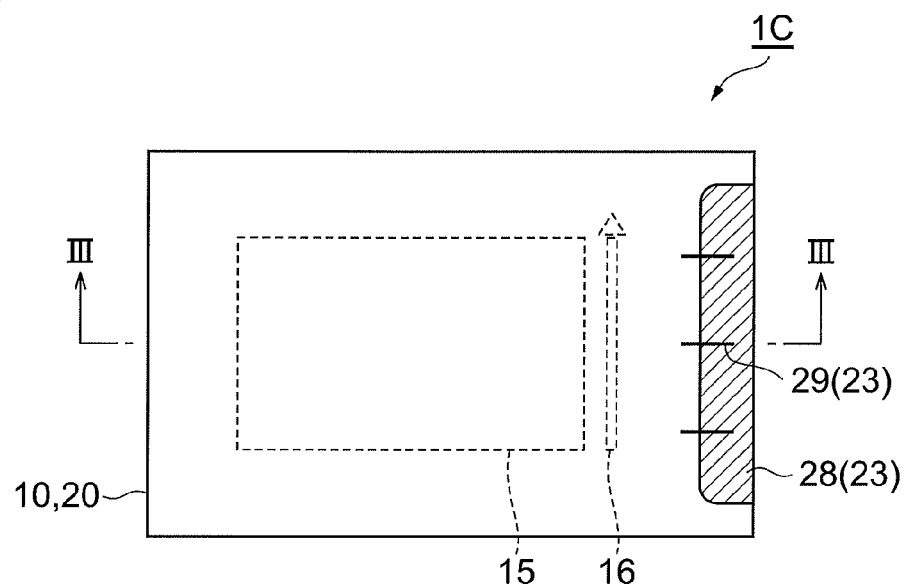
FIG. 6 includes (a) a top view, and (b) a side sectional view showing a configuration of a third embodiment of the X-ray imaging device.
Figure 6:
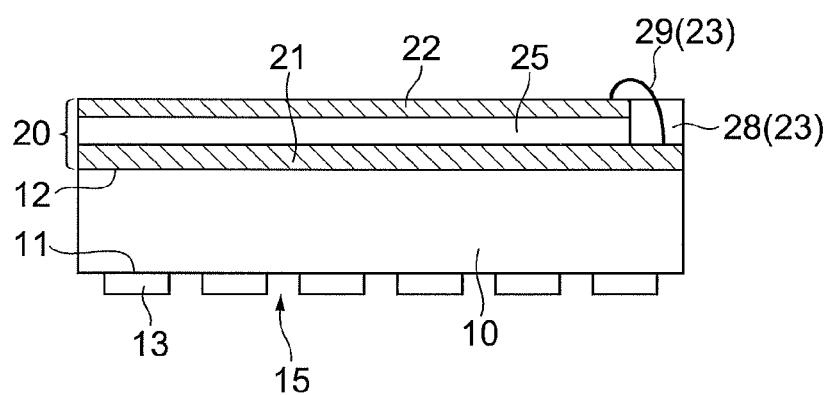

FIG. 6 is a figure including (a) a top view and (b) a side sectional view showing a configuration of a third embodiment of the X-ray imaging device. Here, (b) in FIG. 6 is a sectional view along line shown in (a) in FIG. 6. The X-ray imaging device 1C of the present embodiment includes a solid-state image pickup element 10 and a shielding layer 20. The configuration of the image pickup element 10 and the basic lamination structure of the shielding layer 20 are the same as those of the X-ray imaging device 1A shown in FIG. 2.

In the X-ray imaging device 1C of the present embodiment, in the shielding layer 20 in the region facing the right side of the image pickup element 10, the ultraviolet light shielding layer 25 and the second aluminum layer 22 are not formed, and a stepped portion (first aluminum layer exposed portion) 28 in which the first aluminum layer 21 is exposed is provided. In this stepped portion 28, conducting portions 23 are formed by electrically connecting the aluminum layers 21 and 22 by conductive wires 29. Also with this configuration, by conduction between the aluminum layers 21 and 22 by the stepped portion 28 and the conductive wires 29, the second aluminum layer 22 can be preferably prevented from being electrically-charged.

Figure 7:
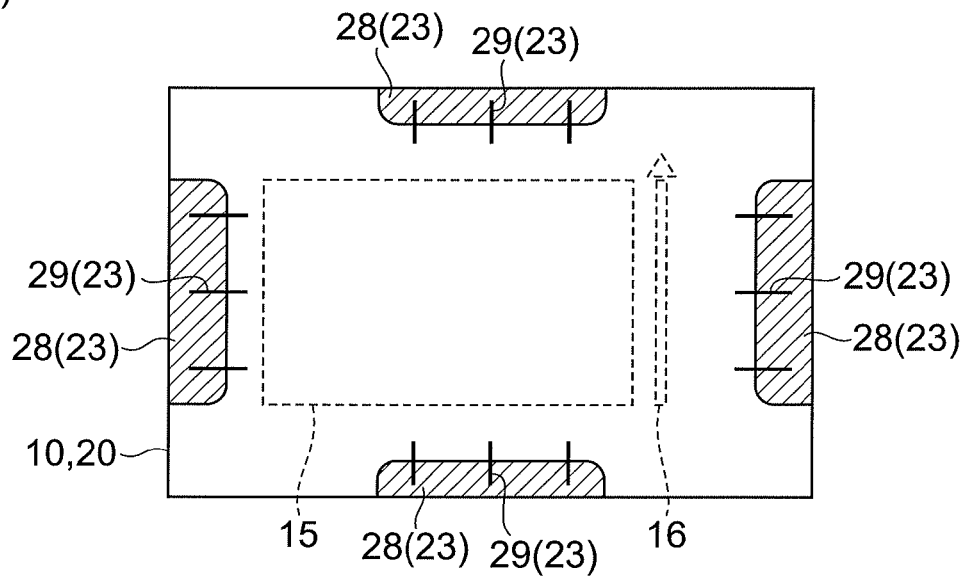
FIG. 7 includes top views showing variation examples of the X-ray imaging device shown in FIG. 6.
Figure 7:
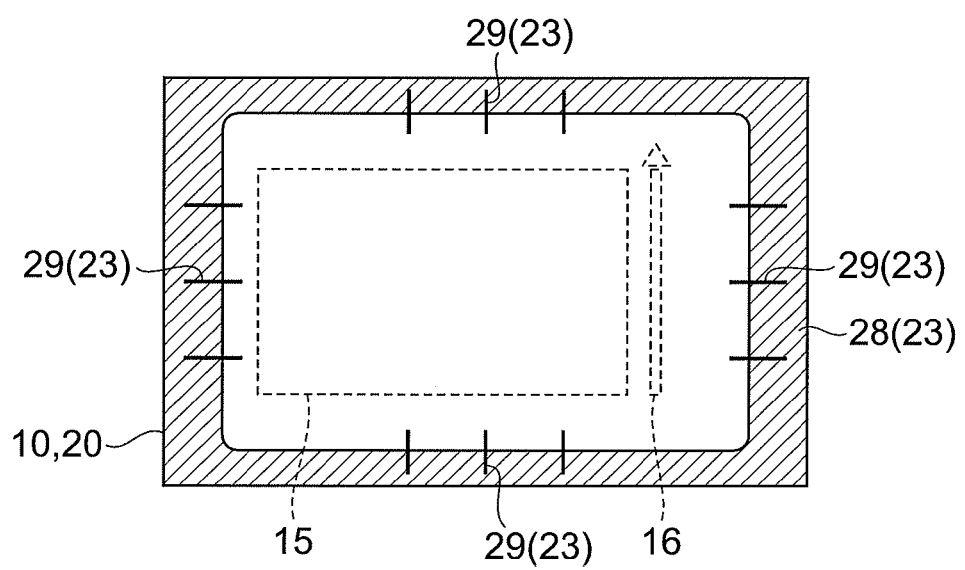

As the configuration of the stepped portion 28 and the conductive wire 29 in the shielding layer 20, specifically, various configurations can be used as shown by variation examples in FIG. 7 of the X-ray imaging device shown in FIG. 6. In the configuration shown in (a) in FIG. 7, in the shielding layer 20 in the region facing the right side, the region facing the left side, the region facing the upper side, and the region facing the lower side of the image pickup element 10, stepped portions 28 are provided, respectively, and by electrically connecting the aluminum layers 21 and 22 by conductive wires 29 in these stepped portions 28, conducting portions 23 are formed. In the configuration shown in (b) in FIG. 7, in the shielding layer 20 in the above-described regions, a stepped portion 28 integrated so as to surround the detection section 15 is provided, and by electrically connecting the aluminum layers 21 and 22 by conductive wires 29 in this stepped portion 28, conducting portions 23 are formed.

Figure 8:
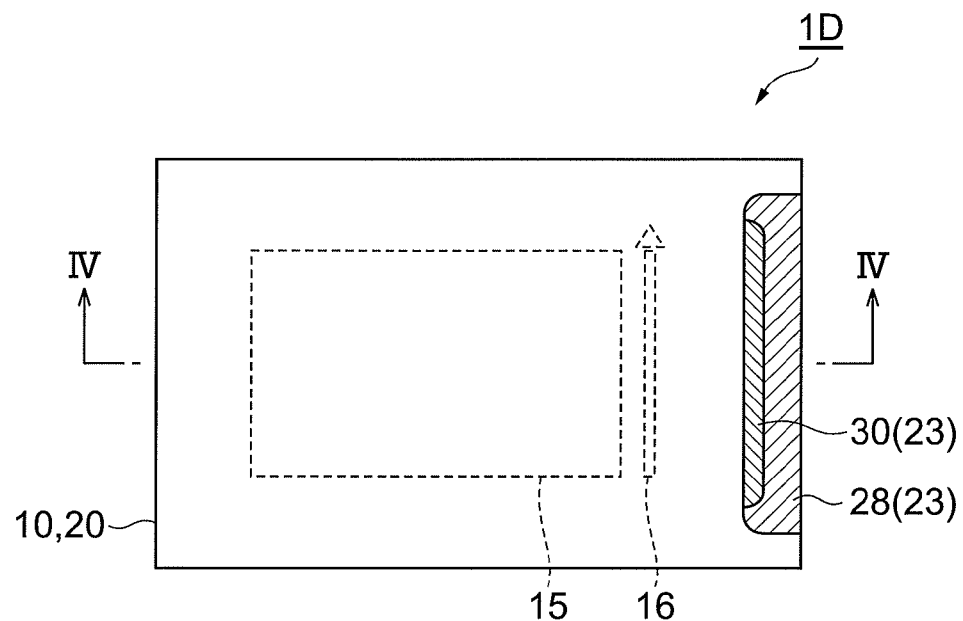
FIG. 8 includes (a) a top view, and (b) a side sectional view showing a configuration of a fourth embodiment of the X-ray imaging device.
Figure 8:
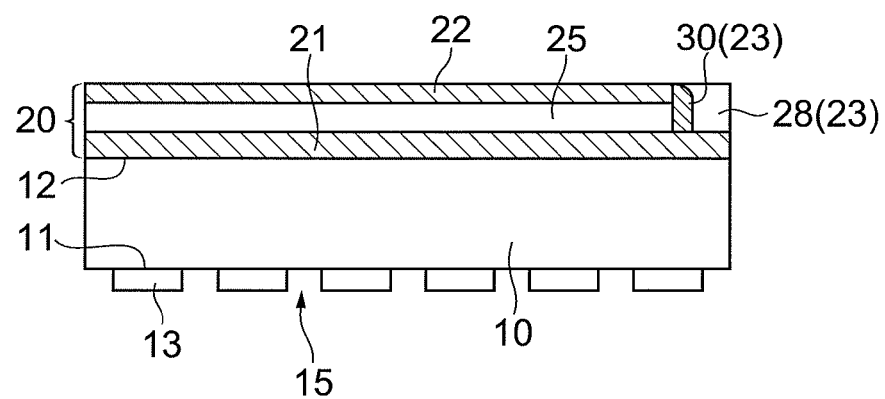

FIG. 8 is a figure including (a) a top view and (b) a side sectional view showing a configuration of a fourth embodiment of the X-ray imaging device. Here, (b) in FIG. 8 is a sectional view along line IV-IV shown in (a) in FIG. 8. The X-ray imaging device 1D of the present embodiment includes a solid-state image pickup element 10 and a shielding layer 20. The configuration of the image pickup element 10 and the basic lamination structure of the shielding layer 20 are the same as those of the X-ray imaging device 1A shown in FIG. 2.

In the X-ray imaging device 1D of the present embodiment, in the shielding layer 20 in the region facing the right side of the image pickup element 10, the ultraviolet light shielding layer 25 and the second aluminum layer 22 are not formed, and a stepped portion (first aluminum layer exposed portion) 28 in which the first aluminum layer 21 is exposed is provided. In this stepped portion 28, by electrically connecting the aluminum layers 21 and 22 by a resin conducting portion 30, a conducting portion 23 is formed. Also with this configuration, by conduction between the aluminum layers 21 and 22 by the stepped portion 28 and the resin conducting portion 30, the second aluminum layer 22 can be preferably prevented from being electrically-charged.

Figure 9:
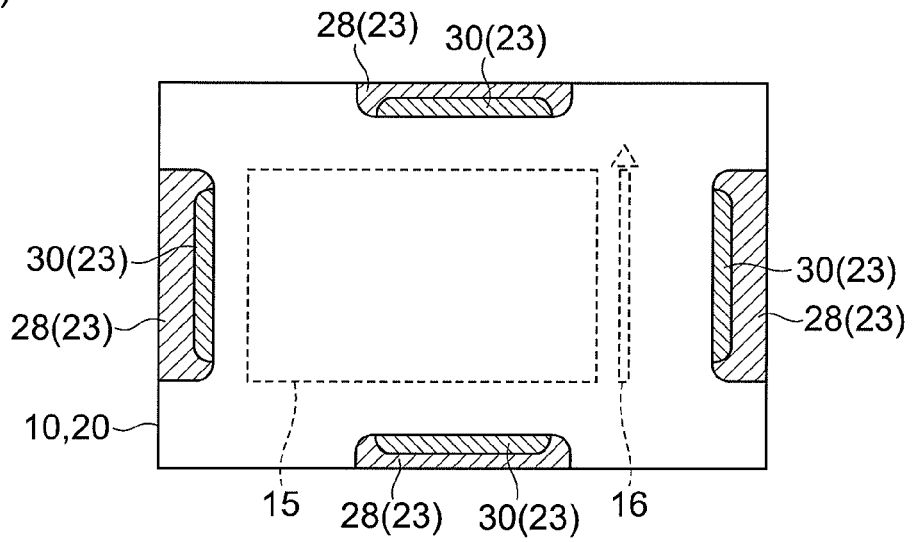
FIG. 9 includes top views showing variation examples of the X-ray imaging device shown in FIG. 8.
Figure 9:
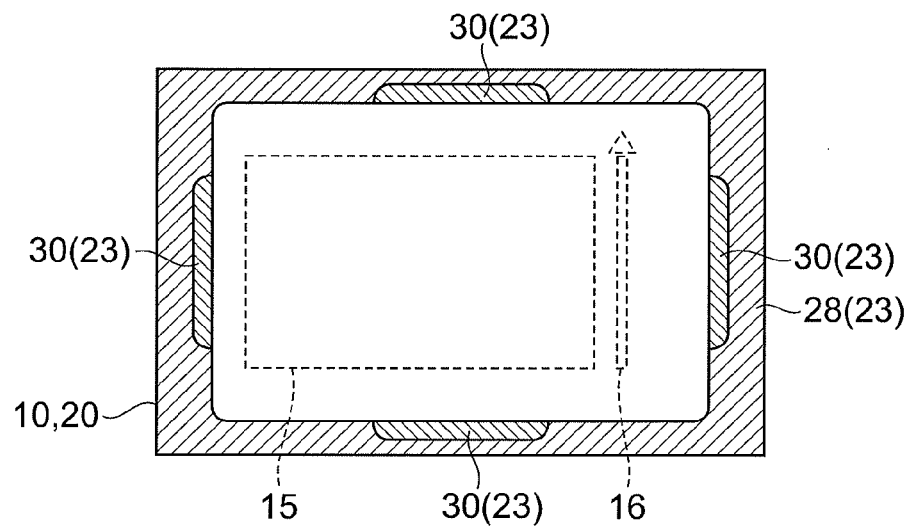

As the configuration of the stepped portion 28 and the resin conducting portion 30 in the shielding layer 20, specifically, various configurations can be used as shown by variation examples in FIG. 9 of the X-ray imaging device shown in FIG. 8. In the configuration shown in (a) in FIG. 9, in the shielding layer 20 in the region facing the right side, the region facing the left side, the region facing the upper side, and the region facing the lower side of the image pickup element 10, stepped portions 28 are provided, respectively, and by electrically connecting the aluminum layers 21 and 22 by resin conducting portions 30 in these stepped portions 28, conducting portions 23 are formed. In the configuration shown in (b) in FIG. 9, in the shielding layer 20 in the above-described regions, a stepped portion 28 integrated so as to surround the detection section 15 is provided, and by electrically connecting the aluminum layers 21 and 22 by the resin conducting portions 30 in the stepped portion 28, conducting portions 23 are formed.

The X-ray imaging device according to the present invention is not limited to the above-described embodiments and configuration examples, but can be modified in many ways. For example, in the above-described embodiments, only one ultraviolet light shielding layer 25 is provided between the first and second aluminum layers 21 and 22, however, a plurality of layers including the ultraviolet light shielding layer 25 may be provided between the aluminum layers 21 and 22. In the above-described embodiments, the second aluminum layer 22 is the outermost layer in the shielding layer 20, however, an additional layer may be further provided as the outermost layer on the outer side of the aluminum layer 22.

The X-ray imaging device according to the above-described embodiment includes: (1) a back-illuminated solid-state image pickup element including an X-ray detection section having a plurality of detection pixels arrayed for detecting incident X-rays formed on one surface side, and an X-ray incident surface on the other surface, and (2) a shielding layer provided on the X-ray incident surface of the solid-state image pickup element and to be used for blocking light rays with wavelengths longer than the wavelength of X-rays as a detection target, wherein (3) the shielding layer includes a first aluminum layer provided directly on the X-ray incident surface, a second aluminum layer provided on the first aluminum layer, and an ultraviolet light shielding layer that is provided between the first aluminum layer and the second aluminum layer and is used for blocking ultraviolet light rays.

Here, as the ultraviolet light shielding layer to be provided between the first and second aluminum layers, specifically, a shielding layer formed of a polyimide layer is preferably used. With the shielding layer using polyimide as a material, a sufficient shielding effect can be obtained for ultraviolet light rays to be incident on the image pickup element.

In the shielding layer of the above-described configuration, the second aluminum layer is preferably the outermost layer in the shielding layer. Accordingly, the above-described erosion, etc., of the shielding layer (for example, polyimide layer) due to atomic oxygen can be reliably suppressed.

Further, the shielding layer of the above-described configuration is preferably provided with a conducting portion for electrically connecting the first aluminum layer and the second aluminum layer. Accordingly, the second aluminum layer positioned on the outer side can be prevented from being electrified, and the image pickup element can be operated stably.

In this case, the conducting portion is preferably provided in a region excluding a region corresponding to the X-ray detection section (region out of the X-ray detection section as viewed in the X-ray incident direction) with respect to the solid-state image pickup element. Accordingly, the ultraviolet light shielding effect for the X-ray detection section can be prevented from being deteriorated due to formation of the conducting portion between the first and second aluminum layers.

Industrial Applicability

The present invention is applicable as an X-ray imaging device capable of preferably suppressing the influence of detection of noise light in X-ray detection.

Reference Signs List 1, 1A, 1B, 1C, 1D—X-ray imaging device, 10—solid-state image pickup element (X-ray CCD), 11—front surface, 12—X-ray incident surface, 13—surface electrode, 15—X-ray detection section, 16—charge transfer section, 20—shielding layer, 21—first aluminum layer, 22—second aluminum layer, 23—conducting portion, 25—ultraviolet light shielding layer (polyimide layer), 26—opening, 27—resin conducting portion, 28—stepped portion, 29—conductive wire, 30—resin conducting portion.

The invention claimed is:

1. An X-ray imaging device comprising:
a back-illuminated solid-state image pickup element including an X-ray detection section having a plurality of detection pixels that are arrayed for detecting incident X-rays formed on one surface side, and an X-ray incident surface on the other surface; and
a shielding layer provided on the X-ray incident surface of the solid-state image pickup element and to be used for blocking light rays with wavelengths longer than the wavelength of X-rays as a detection target, wherein
the shielding layer includes
a first aluminum layer provided directly on the X-ray incident surface,
a second aluminum layer provided on the first aluminum layer, and
an ultraviolet light shielding layer provided between the first aluminum layer and the second aluminum layer and to be used for blocking ultraviolet light rays.

2. The X-ray imaging device according to claim 1, wherein the ultraviolet light shielding layer is formed of a polyimide layer.

3. The X-ray imaging device according to claim 1, wherein the second aluminum layer is the outermost layer in the shielding layer.

4. The X-ray imaging device according claim 1, wherein a conducting portion for electrically connecting the first aluminum layer and the second aluminum layer is provided.

5. The X-ray imaging device according to claim 4, wherein the conducting portion is provided in a region excluding a region corresponding to the X-ray detection section on the solid-state image pickup element.

* * * * *